(12) United States Patent
Robert et al.

(10) Patent No.: US 10,064,265 B2
(45) Date of Patent: Aug. 28, 2018

(54) FLEXIBLE PRINTED CIRCUIT HAVING A LOW EMISSIVITY

(71) Applicant: SOCIÉTÉ FRANÇAISE DE DÉTECTEURS INFRAROUGES—SOFRADIR, Palaiseau (FR)

(72) Inventors: David Robert, Saint Nizier du Moucherotte (FR); Yves Royer, Vinay (FR)

(73) Assignee: SOCIÉTÉ FRANÇAISE DE DÉTECTEURS INFRAROUGES—SOFRADIR, Palaiseau (FR)

( * ) Notice: Subject to any disclaimer, the term of this patent is extended or adjusted under 35 U.S.C. 154(b) by 0 days.

(21) Appl. No.: 15/027,177

(22) PCT Filed: Sep. 29, 2014

(86) PCT No.: PCT/FR2014/052448
§ 371 (c)(1),
(2) Date: Apr. 4, 2016

(87) PCT Pub. No.: WO2015/049448
PCT Pub. Date: Apr. 9, 2015

(65) Prior Publication Data
US 2016/0242270 A1    Aug. 18, 2016

(30) Foreign Application Priority Data
Oct. 2, 2013   (FR) ...................................... 13 02295

(51) Int. Cl.
*H05K 1/02*      (2006.01)
*G01J 5/06*      (2006.01)
(Continued)

(52) U.S. Cl.
CPC .............. *H05K 1/0201* (2013.01); *G01J 5/06* (2013.01); *G01J 5/061* (2013.01); *G01J 5/10* (2013.01);
(Continued)

(58) Field of Classification Search
CPC .... G01J 5/06; G01J 5/061; G01J 5/10; H05K 1/0209; H05K 1/0296; H05K 1/0218;
(Continued)

(56) References Cited

U.S. PATENT DOCUMENTS 4,118,947 A    10/1978   Diedrich et al.
4,926,007 A *   5/1990   Aufderheide ........ H01B 7/0838
                                                           156/47

(Continued)

FOREIGN PATENT DOCUMENTS

WO      2012/147870 A1    11/2012

OTHER PUBLICATIONS

Dec. 10, 2014 International Search Report issued in International Patent Application No. PCT/FR2014/052448.
(Continued)

*Primary Examiner* — Hoa C Nguyen
(74) *Attorney, Agent, or Firm* — Oliff PLC

(57) ABSTRACT

A flexible printed circuit of low emissivity including first and second ends and a flexible central portion extending between the first and second ends and including electrically-conductive tracks, coated with a polymer material, to electrically connect the first and second ends. The flexible central portion is at least partly covered with a heat shield formed in a material having an emissivity smaller than those of the polymer material and of the electrically-conductive tracks.

15 Claims, 2 Drawing Sheets

A-A

(51) Int. Cl.
  *G01J 5/10* (2006.01)
  *H01R 12/77* (2011.01)
  *H05K 1/11* (2006.01)
  *H05K 1/14* (2006.01)

(52) U.S. Cl.
  CPC ............. *H01R 12/77* (2013.01); *H05K 1/028* (2013.01); *H05K 1/0209* (2013.01); *H05K 1/0296* (2013.01); *H05K 1/11* (2013.01); *H05K 1/0218* (2013.01); *H05K 1/147* (2013.01); *H05K 2201/06* (2013.01); *H05K 2201/066* (2013.01); *H05K 2201/0715* (2013.01)

(58) Field of Classification Search
  CPC ........ H05K 1/028; H05K 1/0201; H05K 1/11; H05K 1/147; H05K 2201/066; H05K 2201/0715; H05K 2201/06; H01R 12/77
  See application file for complete search history.

(56) References Cited

U.S. PATENT DOCUMENTS

| | | | |
|---|---|---|---|
| 5,446,239 A * | 8/1995 | Mizutani | H01B 7/0838 174/117 F |
| 2003/0112617 A1 * | 6/2003 | Ueno | H01B 7/0861 361/826 |
| 2008/0083559 A1 * | 4/2008 | Kusamitsu | H05K 3/281 174/254 |
| 2011/0024162 A1 * | 2/2011 | Oikawa | B60R 16/0207 174/254 |
| 2011/0100673 A1 * | 5/2011 | Takamatsu | H01B 7/0861 174/102 SP |
| 2014/0014409 A1 * | 1/2014 | Lin | H02G 15/08 174/75 R |
| 2014/0054081 A1 | 2/2014 | Kido et al. | |
| 2015/0136478 A1 * | 5/2015 | Biesse | B60R 16/06 174/72 A |

OTHER PUBLICATIONS

Dec. 10, 2014 Written Opinion issued in International Patent Application No. PCT/FR2014/052448.

Apr. 5, 2016 International Preliminary Report on Patentability issued in International Patent Application No. PCT/FR2014/052448.

* cited by examiner

A-A

FLEXIBLE PRINTED CIRCUIT HAVING A LOW EMISSIVITY

BACKGROUND OF THE INVENTION

The invention relates to a flexible printed circuit having a low emissivity and to the use thereof in a cooled infrared detector.

STATE OF THE ART

An infrared photodetector absorbs infrared photons and converts them into an electric signal. It conventionally comprises an array of photosensitive elements, such as photodiodes, quantum wells, or quantum dots. The detection material, which forms the photosensitive elements, is for example an alloy of tellurium, mercury, and cadmium (HgCgTe).

In infrared radiation (wavelength varying from 0.7 µm to 14 µm), the photons to be detected have an energy comparable to the thermal noise of the detection material, when the latter operates at ambient temperature. Thus, so that it does not dazzle itself, the detector is cooled to a temperature in the range from 50 K to 200 K. The detection block is thermally coupled to a cryostat containing, according to the temperature of use, liquid nitrogen, liquid helium, or a cryogenerator device.

FIG. 1 schematically shows a conventional example of an infrared detector provided with a detection block 10 and with its cryostat 20.

The infrared detector comprises a detection circuit 12 formed of an HgCgTe substrate containing an array of photodiodes. Detection circuit 12 is coupled to a read circuit 14 formed of a silicon substrate. Circuit 14 enables to read and to amplify the signals generated by the photodiodes of the detection circuit.

Detection circuit 12 is conventionally hybridized on read circuit 14, to form a one-piece assembly and to ease the electric connection between these two circuits. To achieve this, the front surface of detection circuit 12 is connected to the front surface of read circuit 14, by means of indium microspheres 16. An infrared radiation, symbolized by arrows 18 in FIG. 1, reaches the photodiodes from the rear surface of detection circuit 12.

Detection block 10, formed of circuits 12, 14 and of microspheres 16, is placed in cryostat 20. The latter comprises a tight package 22, a cold source 24, and a cold finger 26 allowing a thermal exchange between the cold source and the detection block.

Package 22 defines a tight volume having detection block 10 placed therein. It is provided with a window 22' transparent to infrared rays 18, located above detection circuit 12 and parallel thereto.

Cold finger 26 is, at its lower end, in thermal contact with cold source 24. At its upper end, it is topped with a cold plane 28, or cold table, arranged perpendicularly to cold finger 26. This cold plane is used as a mechanical support for detection block 10. It is made of a material which is a good heat conductor, for example, alumina.

Thus, detection block 10 is thermally connected to cold source 24, via cold finger 26 and cold plane 28.

The detector is further equipped with a cold shield 30, pierced with an aperture 30' behaving as a diaphragm. Aperture 30' determines the angle under which detection circuit 12 sees incident infrared radiation 18. Cold shield 30 absorbs the parasitic radiation originating from the hot walls of the cryostat and the unwanted reflections of useful radiation 18. The cold shield is one with cold plane 28 in terms of mechanical and thermal behavior.

A so-called proximity electronic board 40 is located outside of cryostat 20. This board generates the signals necessary to drive detection circuit 12 and digitizes the signals originating from the detector, by means of analog-to-digital converters.

The electric connection between read circuit 14 and proximity board 40 is ensured by contact pads 42 on the read circuit, solder wires 44, and then metal tracks in cold table 28 made of alumina, and finally a flexible printed circuit 46. Flexible printed circuit 46 is, on the one hand, fastened to cold table 28 by a first electric connector 48a and, on the other hand, fastened to a wall of package 22 and to electronic board 40 by a second electric connector 48b.

The temperature of the infrared detector has a direct influence on the performances thereof, particularly the dark current. For high detection performances, the temperature of the focal plane, in other words, the temperature of the detection circuit, should be kept constant.

To limit thermal losses, vacuum is created in the cryostat chamber delimited by package 22. Thus, the heat transfer by convection from the hot portions of the cryostat to the detection circuit, is nonexistent.

However, it is not provided, in the detector of FIG. 1, to limit heat transfers by conduction and by radiation. Now, such heat flows adversely affect the detector performances and the cryostat efficiency.

SUMMARY

It can be observed that there is a need to limit heat losses in an infrared detector, to optimize the cooling thereof.

This need tends to be satisfied by providing in the infrared detector a flexible printed circuit having a decreased emissivity. Such a printed circuit comprises first and second ends, and a flexible central portion extending between the first and second ends. The central portion comprises electrically-conductive tracks, coated with a polymer material, to electrically connect the first and second ends. Further, it is at least partly covered with a heat shield made of a material having an emissivity smaller than those of the polymer material and of the electrically-conductive tracks.

In a preferred embodiment, the material of the thermal insulation layer is electrically conductive. It is advantageously selected from among the following metals: gold, silver, copper, and tungsten.

The invention also aims at an infrared detector provided with such a flexible printed circuit. The first end of the flexible circuit is thermally connected to a cold source of the detector and the second end is thermally connected to a hot source. This results in a temperature gradient in the flexible central portion.

BRIEF DESCRIPTION OF THE DRAWINGS

The foregoing and other features and advantages will more clearly appear from the following non-limiting description of specific embodiments in connection with the accompanying drawings, among which.

DESCRIPTION OF A PREFERRED EMBODIMENT

Figure 1:
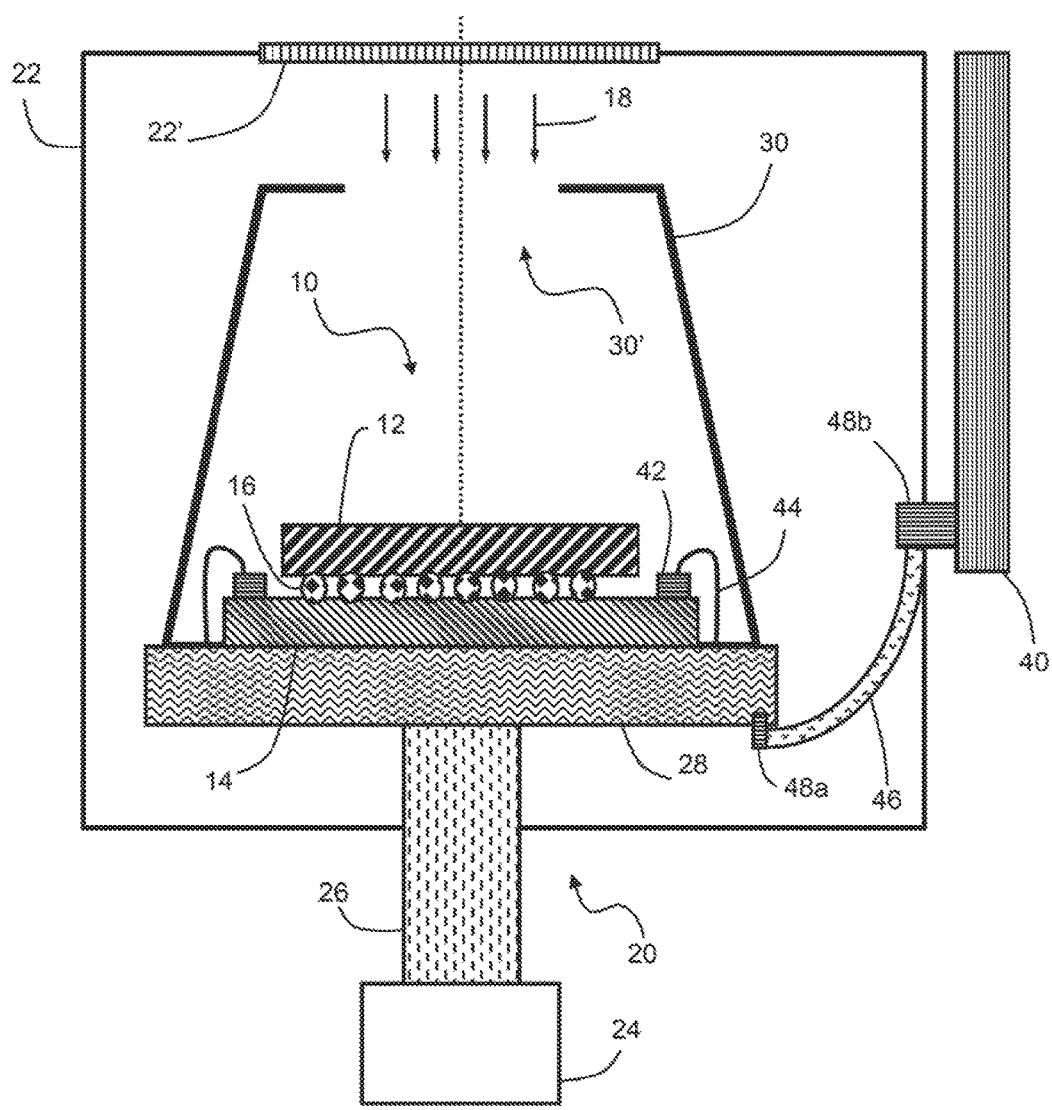
FIG. 1, previously described, shows an infrared detector according to prior art.

Flexible printed circuit 46 of FIG. 1, currently called flexible printed circuit board (flex-PCB), is mainly formed of a film of polymer material, generally polyimide. It comprises metal tracks embedded in the polyimide film. Such metal tracks electrically connect the two connectors placed at the ends of the flexible printed circuit.

The printed circuit is submitted to a temperature difference since one of its ends is attached to the cold table (inside of the cryostat) and the other end is attached to the cryostat wall (exchanging heat with the outside). Further, the metal (aluminum, copper) which forms the circuit tracks is generally a good heat conductor. Thus, the metal tracks conduct the heat from one electric connector to the other, and more particularly from the cryostat wall to the cold table of the detector. Such a conductive heat transfer however only amounts to a small part of heat losses.

The major part of the heat losses is caused by a phenomenon of radiation of the flexible printed circuit. Indeed, the surface of the flexible printed circuit emits, like all other bodies, an electromagnetic radiation whatever its temperature. Such an electromagnetic radiation is all the more intense as the circuit temperature is high. It may also be called thermal radiation.

In addition to temperature, the power radiated by the flexible printed circuit depends on the emissivity of the materials which form its surface. The emissivity of a material, noted ε, may be defined as being the ratio of the energy radiated by a surface to the energy of the incident flow received by this surface. Thus, the higher the emissivity of the material, the more significant the radiated energy.

In the case of a conventional flex circuit based on polyimide, the emissivity coefficient is high, approximately equal to 0.7. The heat radiated by the flex circuit inside of the cryostat is thus significant.

To overcome such radiative heat losses, it is provided to at least partly cover a portion of the flexible printed circuit with a heat insulation layer, or heat shield, made of a material having an emissivity smaller than those of polyimide and of the metal tracks. Thus, the thermal energy radiated by the flex circuit in the cryostat chamber is decreased as compared with a conventional flex circuit comprising no heat shield.

Figure 2:
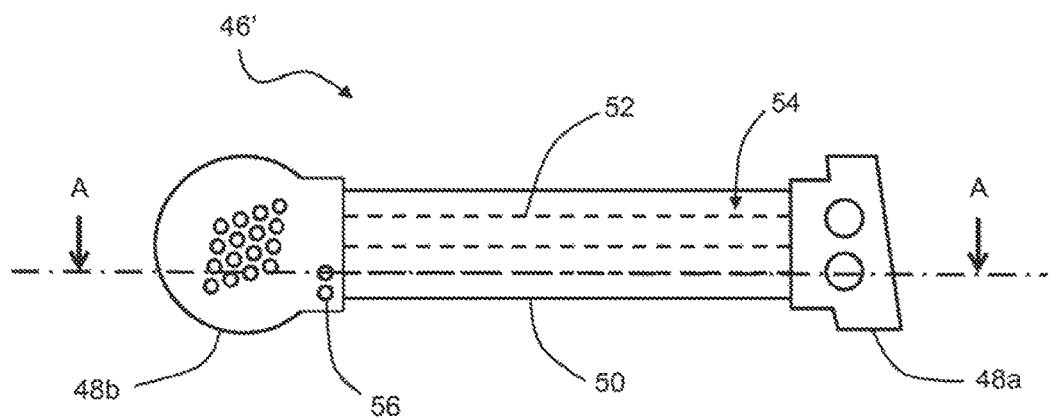
FIG. 2 is a schematic top view of a flexible printed circuit provided with a thermal insulation layer according to the invention.
Figure 3:
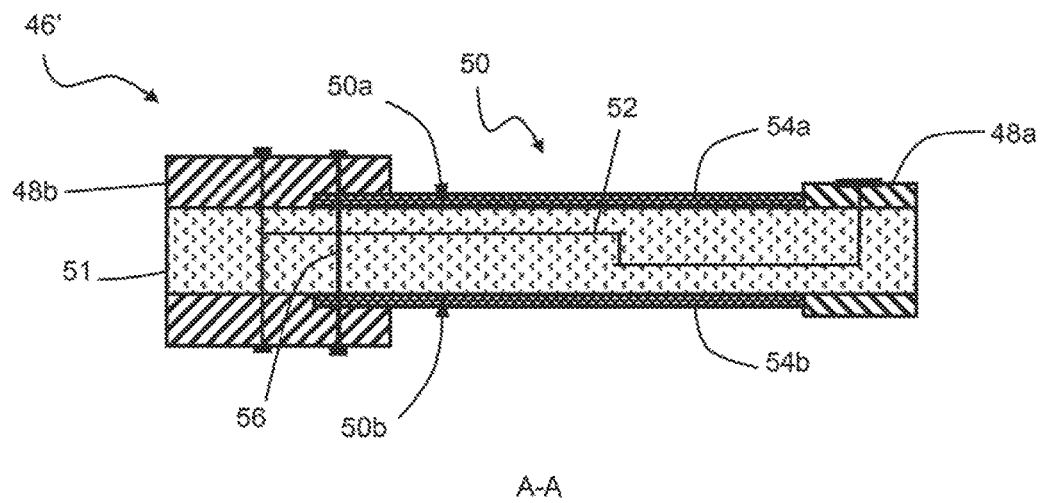
FIG. 3 shows, in cross-section view along axis A-A, the flexible printed circuit according to FIG. 2.

FIGS. 2 and 3 show, respectively in top view and in transverse cross-section view, a flexible printed circuit 46' having a low emissivity.

Printed circuit 46', of elongated shape, comprises two electric connectors 48a and 48b located at opposite ends of the printed circuit and a flexible central portion 50, for example, of rectangular shape extending between the two connectors 48a and 48b. "Flexible central portion" designates one or a plurality of stacked materials capable of bending with a radius of curvature smaller than 20 mm.

Printed circuit 46' comprises, at least in its central portion 50, a polymer film 51, for example, polyimide, and metal electric tracks 52 coated with the polymer material. Tracks 52 electrically connect the two connectors 48a and 48b.

Electric connectors 48a and 48b may be rigid or flexible, like polymer film 51. They may further comprise mechanical fastening elements, to be assembled on the detector elements. Metal parts, such as shims or reinforcements, may be provided for this purpose.

As an example, connector 48b of FIGS. 2 and 3 comprises an assembly of holes formed in a printed circuit and which superpose to those formed in polymer film 51. Connector 48a more simply comprises bonding pads.

Printed circuit 46' also comprises a heat shield 54 covering at least a portion of central portion 50. Shield 54 is made of a material having an emissivity coefficient smaller than the emissivity coefficients of the polymer and of electric tracks 52. Preferably, the emissivity coefficient of shield 54 is smaller than or equal to 0.05.

In the preferred embodiment of FIGS. 2 and 3, flexible central portion 50 comprises two main surfaces 50a and 50b, advantageously parallel (FIG. 3). Heat shield 54 covers at least one of these surfaces. Preferably, each of surfaces 50a, 50b is entirely covered with a thermal insulation layer, respectively 54a and 54b.

The material of shield 54 (or of shields 54a and 54b) is preferably electrically conductive. This material is advantageously selected from among gold, silver, copper, and tungsten, which belong to the materials of lowest emissivity (emissivity respectively between 0.018 and 0.035, between 0.02 and 0.032, between 0.03 and 0.04).

The deposition of a metal of low emissivity such as gold on the flex circuit has not been envisaged up to now, since metals are good heat conductors. The deposition of a metal layer will thus result in increasing the conductive heat flow, which is desired to be avoided. It can however be observed that the radiation decrease is more significant than the increase of the conduction phenomenon. Heat losses are thus generally decreased.

Thus, against all odds, it is possible to decrease heat losses in an infrared detector by depositing a metal layer of small thickness and of low emissivity on the flexible printed circuit, since heat conduction is a minor phenomenon as compared with heat radiation.

The conductive heat transfer increases with the thickness of heat shield 54. In the printed circuit of FIGS. 2 and 3, the thickness of shield 54 is advantageously selected to be between 50 nm and 200 nm. Such a thickness range enables to obtain a good tradeoff between conduction and radiation phenomena.

Further, the use of an electrically-conductive material as a heat shield enables to decrease the electromagnetic noise due to the environment where the detector is located.

As an example, cooled infrared detectors are currently used in satellites, for terrestrial or spatial observation. They are then submitted to significant electromagnetic radiation, including solar radiation, which creates electric charges in the detector parts. Electrically-conductive shield 54 enables to drain off such electric charges, thus decreasing their impact on infrared detection. To achieve this, one may provide in the flexible printed circuit of FIGS. 2 and 3 at least one interconnection via 56 between metal shield 54 and one of the metal tracks 52 which convey the current.

Flexible printed circuit 46' is as simple to manufacture and to use as prior art flexible printed circuits. Indeed, its forming only requires standard methods in the industry of PCB circuits.

Shield 54 is preferably formed by depositing the material of low emissivity on the flexible printed circuit, for example by vacuum sputtering. As a variation, shield 54 may be formed of a single layer insulation, SLI, or of a stack of a plurality of SLIs (multiple layer insulation, MLI). In this case, it is bonded to the polymer surface of the printed circuit, for example, by means of an adhesive.

Flexible printed circuit 46' is especially intended to be integrated in the cryostat of a cooled infrared detector, between the detection circuit of the detector and the cryostat wall. The outer wall of the cryostat may support a proximity board. The signals for addressing the detector and the signals originating therefrom then transit through the electric tracks of the flexible printed circuit, between the detection circuit and the proximity board.

In this preferred application of the low-emissivity flex circuit, connector 48a is electrically and mechanically connected to the cold table or to the read circuit of the infrared detector. Thus, one end of the printed circuit is thermally connected to the cold source of the detector. The cold source is, according to the temperature of use, a liquid nitrogen, liquid helium, or liquid air tank. It may also be a refrigerating machine, for example, a pulsed gas tube. Conventionally, the cold table supporting the detection circuit is thermally connected to the cold source via a cold finger. Preferably, the temperature of the cold source is approximately 50 K.

The opposite end, which supports connector 48b, is thermally connected to a hot source, that is, the outer wall of the cryostat and the proximity board, both at the ambient temperature. This ambient temperature is much higher than the nominal operating temperature of the detection circuit. It is for example equal to 300 K.

Finally, vacuum is created in the cryostat, to cancel convective heat transfers.

The invention claimed is:

1. Flexible printed circuit comprising:
   first and second electric connectors; and
   a flexible central portion extending between the first and second electric connectors and comprising electrically-conductive tracks arranged to electrically connect the first and second electric connectors, the electrically-conductive tracks being coated with a polymer material,
   wherein
   the flexible central portion is at least partly covered with a heat shield made of a material having an emissivity smaller than the emissivity of the polymer material and the emissivity of the electrically-conductive tracks, and the heat shield is separated from the electrically-conductive tracks by the polymer material, the heat shield having a thickness in the range from 50 to 200 nm configured so as to block thermal transfer by conduction in the heat shield between the first electric connector and the second electric connector.

2. Flexible printed circuit according to claim 1, wherein the material of the heat shield has an emissivity smaller than 0.05.

3. Flexible printed circuit according to claim 1, wherein the flexible central portion comprises a first and a second opposite main faces, each covered with the heat shield.

4. Flexible printed circuit according to claim 3, wherein each heat shield is an outermost layer of the central portion.

5. Flexible printed circuit according to claim 1, wherein the material of the heat shield is electrically conductive.

6. Flexible printed circuit according to claim 5, wherein the material of the heat shield is selected from the group consisting of gold, silver, copper, and tungsten.

7. Flexible printed circuit according to claim 5, comprising an electric interconnection between one of the conductive tracks and the heat shield.

8. Infrared detector comprising a hot source, a cold source, and a flexible printed circuit according to claim 1, wherein the first electric connector is thermally connected to the cold source and the second electric connector is thermally connected to the hot source, which results in a temperature gradient in the flexible central portion.

9. Infrared detector according to claim 8, wherein the flexible printed circuit is arranged inside of a vacuum cryostat chamber.

10. Flexible printed circuit according to claim 1, wherein the flexible central portion and the heat shield together comprise successively:
    a first heat shield,
    the electrically-conductive tracks coated with the polymer material,
    a second heat shield.

11. Flexible printed circuit according to claim 1, wherein the heat shield is the outermost layer of the central portion.

12. Flexible printed circuit comprising:
    first and second electric connectors; and
    a flexible central portion extending between the first and second electric connectors and comprising electrically-conductive tracks arranged to electrically connect the first and second electric connectors, the electrically-conductive tracks being coated with a polymer material,
    wherein
    the flexible central portion is at least partly covered with a heat shield made of a material having an emissivity smaller than the emissivity of the polymer material and the emissivity of the electrically-conductive tracks, and the heat shield is separated from the electrically-conductive tracks by the polymer material,
    the material of the heat shield is selected from the group consisting of gold, silver, and tungsten, and
    the heat shield has a thickness in the range from 50 to 200 nm configured so as to block thermal transfer by conduction in the heat shield between the first electric connector and the second electric connector.

13. Flexible printed circuit according to claim 12, wherein the flexible central portion comprises a first and a second opposite main faces, each covered with the heat shield.

14. Flexible printed circuit according to claim 13, wherein each heat shield is an outermost layer of the central portion.

15. Flexible printed circuit according to claim 12, wherein the heat shield is the outermost layer of the central portion.

* * * * *